(12) United States Patent
Funkhanel et al.

(10) Patent No.: US 6,269,822 B1
(45) Date of Patent: Aug. 7, 2001

(54) INSTALLATION FOR WET-TREATING SUBSTRATES

(75) Inventors: Jurgen Funkhanel, Donaueschingen; Dieter Meister, Blumberg; Martin Weber, Elsaor; Felix Wehrle, Donaueschingen, all of (DE)

(73) Assignee: Steag Microtech GmbH (DE)

( * ) Notice: Subject to any disclaimer, the term of this patent is extended or adjusted under 35 U.S.C. 154(b) by 0 days.

(21) Appl. No.: 09/171,271

(22) PCT Filed: Mar. 27, 1997

(86) PCT No.: PCT/EP97/01574

§ 371 Date: Mar. 22, 1999

§ 102(e) Date: Mar. 22, 1999

(87) PCT Pub. No.: WO97/39475

PCT Pub. Date: Oct. 23, 1997

(30) Foreign Application Priority Data

Apr. 17, 1996 (DE) .............................................. 196 15 108
Sep. 17, 1996 (DE) .............................................. 196 37 875

(51) Int. Cl.⁷ ...................................................... B08B 3/04
(52) U.S. Cl. ................................ 134/61; 68/133; 68/135; 68/902
(58) Field of Search ............................ 134/61, 133, 135, 134/902; 414/937, 938

(56) References Cited

U.S. PATENT DOCUMENTS

| 4,722,752 | 2/1988 | Steck . |
| 4,840,530 | 6/1989 | Nguyen . |
| 4,902,350 | 2/1990 | Steck . |
| 5,299,901 | 4/1994 | Takayama . |
| 5,505,577 | * 4/1996 | Nishi . |
| 5,658,123 | * 8/1997 | Goff et al. . |
| 5,730,162 | * 3/1998 | Shindo et al. ........................ 134/902 |
| 5,803,697 | * 9/1998 | Yun et al. . |
| 5,902,402 | * 5/1999 | Durst et al. ............................ 134/902 |
| 5,964,954 | * 10/1999 | Matsukawa et al. ................. 134/902 |
| 5,980,188 | * 11/1999 | Ko et al. . |

FOREIGN PATENT DOCUMENTS

| 4040132 | * 6/1992 | (DE) ...................................... 134/902 |
| 4413077 | 10/1995 | (DE) . |
| 4425208 | 1/1996 | (DE) . |
| 4428169 | 2/1996 | (DE) . |
| 0385536 | 9/1990 | (EP) . |
| 0682357 | 11/1995 | (EP) . |
| 3-116731 | * 5/1991 | (JP) ...................................... 134/902 |
| 4-196531 | * 7/1992 | (JP) ...................................... 134/902 |
| 05032486 | 1/1993 | (JP) . |

* cited by examiner

Primary Examiner—Frankie L. Stinson
(74) Attorney, Agent, or Firm—Robert W. Becker & Associates

(57) ABSTRACT

In a device for the wet treatment of substrates (3) in a container (1), containing a treatment fluid (2), whereby the substrates (3) are introduced into the container (1) with a substrate carrier (5), an optimal alignment and centering of the substrates (3) will result within the container (1) upon lifting from the container (1) with the aid of a substrate receiving device (4) provided within the container (1).

48 Claims, 15 Drawing Sheets

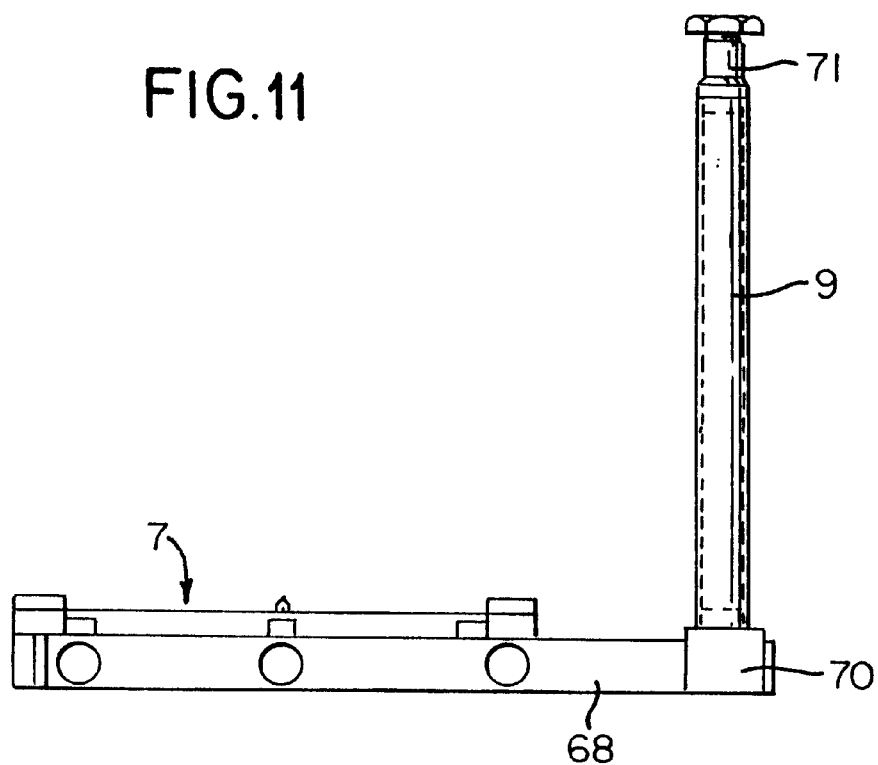
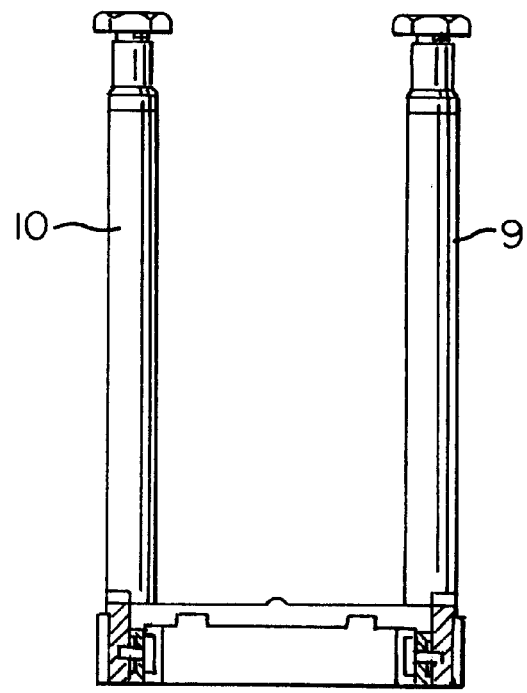

INSTALLATION FOR WET-TREATING SUBSTRATES

BACKGROUND OF THE INVENTION

The present invention relates to a device, respectively, a method for wet treatment of substrates in a container that contains a treatment fluid, whereby the substrates, on a substrate carrier, are introduced into the container.

From EP-A-0 385 536 a method for drying of semiconductor wafers after treatment in a liquid is known. Furthermore, from this printed document it is known to treat wafers positioned in a cassette in a liquid bath whereby the wafers during treatment rest on supports within the cassette. After treatment, an auxiliary cassette is moved directly above the cassette with the wafers positioned within in the liquid. A blade-like lifting device lifts the wafers from the liquid whereby the wafers are dried. During lifting, the wafers are guided in lateral guides of the cassette and, after removal from the liquid, in lateral guides of the auxiliary cassette. When the wafers are completely lifted out of the liquid, the cassette is also lifted from the liquid and dried. The auxiliary cassette is moved in the upward direction so that the wafers again rest on the supports of the cassette outside of the liquid.

In such an arrangement there is however the problem that the wafers in the cassette within the container are not sufficiently aligned, respectively centered, so that they cannot be lifted without risk of damage into external guides, for example, in the aforementioned auxiliary cassette above the liquid. Even for a very minimal deviation from a vertical position, the wafers cannot safely be introduced into the external guides so that the risk of breakage is great. The transport cassettes are exposed to great temperature fluctuations, for example, during the treatment processes temperatures of up to 170° C. may occur, so that tolerance values cannot be maintained, respectively, the cassette may be deformed.

It is therefore an object of the present invention to provide a device for wet treatment with which the substrates in the treatment container and during removal from the treatment container can be aligned and centered as precisely as possible.

A further object of the invention is to provide a carrier for the substrates whose position in the treatment container is always defined, despite occurring temperature fluctuations during treatment. This is also intended for improving the alignment and centering of the substrates.

SUMMARY OF THE INVENTION

This object is inventively solved by providing the container with a receiving device for the substrates.

The object is furthermore solved by providing the device with at least one adapter insertable into the treatment container and having support locations for resting thereon the substrate carrier.

The object is also solved by a substrate carrier, having, for resting it in the container, at least two contact locations arranged centrally in the longitudinal and/or transverse direction.

An advantage of the present invention is that especially large substrates, for example, semiconductor wafers of a diameter of 300 mm, can be dried with the inventive device.

A further advantage of the invention is that with a separate receiving device for the substrates within the container, the cassettes and especially their receiving slots for the wafers can be constructed such that the cassette during outflow of the treatment fluid can be optimally dried. For an optimal alignment of the substrates there are provided especially narrow portions within the guide slots for the substrates which are very difficult to dry.

A further advantage of the inventive device is that with the inventively provided adapters substrate carriers of different sizes can be introduced into the same container and can be secured in a defined position.

An inventive substrate carrier has the advantage that the defined position of the substrate carrier will not change even when a deformation of the substrate carrier due to temperature fluctuations occurs.

According to a preferred embodiment of the invention the receiving device for the substrates and the substrate carrier are movable relative to one another. With this relative movement the transfer of the substrates, held within the substrate carrier for introduction into the container, into the receiving device provided within the container is realized.

Advantageously, the relative movement of the receiving device for the substrates and the substrate carrier is performed in the vertical direction. Thus, drying of the substrates can be performed most effectively because in this manner the treatment fluid adhering to the substrates upon passing through the liquid surface can be removed in the easiest fashion. Furthermore, with a vertical relative movement between the receiving device for the substrates and the substrate carrier, the transfer of the substrates from the substrate carrier into the receiving device for the substrates or the transfer of the substrates back into the substrate carrier in a continuous movement can be combined with removal and drying of the substrates or the substrate carrier.

According to a further preferred embodiment of the invention, the device comprises a first transport carriage for the substrate receiving device and a second transport carriage for the substrate carrier. Preferably, the second transport carriage comprises a substrate carrier receiving unit. Advantageously, the substrate carrier comprises a substrate carrier opening and the substrate receiving unit a receiving opening through which the receiving device can be moved in the vertical direction. Thus, a relative movement between the receiving device for the substrates and the substrate carrier is possible. These substrates are centered within the substrate receiving device and are removed in a continuous movement from the treatment fluid of the container and dried.

Advantageously, the receiving device comprises slots for centering the substrates. Advantageously, the width of the slots tapers from the slot opening to the slot bottom. Especially, one wall of the slot is vertical and another wall of the slot is slanted at a certain angle to the vertical. Due to this special slot shape an optimal centering of the substrate by clamping within the substrate receiving device is possible. Such an embodiment of the slots is advantageous with respect to the centering of the substrates in the receiving device; however, the substrates, during removal from the treatment fluid, should not be secured in such clamping slots because, otherwise, remains of the treatment fluid cannot be removed from the substrates, respectively, the receiving device.

Advantageously, the slot walls in the slot opening area have a second predetermined angle relative to the vertical whereby the second predetermined angle is greater than the first predetermined angle. Thus, a very easy introduction of the substrates into the clamping slots result.

According to a further preferred embodiment of the invention, the container comprises a blade-shaped lifting device for the substrates which is especially a blade-shaped strip that is movable in the vertical direction through an opening in the receiving device, through the substrate carrier opening, and through the receiving opening. The blade-shaped lifting device accordingly can support in a continuous movement the substrates and the receiving device or the substrates alone, when the substrates engage external guides, for example, above the container. The blade-shaped lifting device has the special advantage that, when the substrates are just about to exit through the liquid surface, the drops at the blade-shaped strip flow downwardly.

According to a further preferred embodiment of the invention the device comprises a hood to be attached on top of the container. Advantageously, the hood is provided at least at one inner wall with guide slots for the substrates. The slots in the substrate receiving device are embodied to match the guide slots in the hood. The hood serves a dual purpose. On the one hand, the hood contains an atmosphere of a vapor so that drying by the Marangoni effect is possible (see, for example, the aforementioned EP-A-O 385 536) and, on the other hand, the hood provides external guides so that the substrates above the container are supported only by the blade-shaped lifting device and are lifted while being guided in the guide slots of the hood. The substrate receiving device in this case only serves to hold and center the substrates in the container and therefore must not be removed from the container. Accordingly, the optimal shape for a clamping slot, described above in detail, for centering the substrate in the receiving device can be used.

According to a further preferred embodiment of the invention, the substrates are separated from the substrate carrier for the purpose of drying. The separate removal of the substrates and the substrate carrier prevents that remains of the treatment fluid, respectively, drying spots remain at the contact points.

According to a preferred embodiment the contact locations of the inventive substrate carrier are centrally embodied in the side plates. Contact locations can preferably also be provided centrally at the longitudinal rods or at stays extending downwardly at a slant from the longitudinal rods.

Advantageously, the contact locations are in the form of recesses, especially centering grooves, which are engaged by centering wedges at the container. This advantageous embodiment allows a very exactly defined positioning of the substrate carrier in the treatment container.

According to a further preferred embodiment, the substrate carrier may comprise at least sidewalls in the form of double-wall profiled members which advantageously are embodied with transverse stays. The transverse stays allow handling, especially lifting and lowering, of the substrate carrier, whereby there is still ensured an over all compact and easy-to-handle shape of the substrate carrier.

According to a preferred embodiment the inventive device comprises adapters insertable into the container which have at least two support locations, positioned centrally in the longitudinal and/or transverse direction, for receiving an inventive substrate carrier. The support locations of the adapter are preferably centering wedges matching the centering grooves provided at the substrate carrier.

According to an advantageous embodiment the adapter has two parallel, spaced apart longitudinal beams connected by two perpendicularly arranged transverse beams.

According to a further preferred embodiment the adapter has at least two fixation holes engaged by fixation pins provided at the bottom of the container of the device. Another embodiment is advantageous in which the connection between the adapter and container bottom and/or the connection between adapter and substrate carrier is in the form of the aforedescribed grooves and centering wedges, preferably provided centrally at the longitudinal and/or transverse sides.

Further preferred embodiments of the invention are disclosed in the dependent patent claims.

BRIEF DESCRIPTION OF DRAWING

The invention and further details and advantages thereof will be explained in the following with a particular embodiment in reference to the enclosed Figures. It is shown in:

FIG. 11 a longitudinal sectional view of an inventive receiving unit for the substrate carrier with a securing mechanism connected thereto;

FIG. 12 a side view of the receiving unit for the substrate carrier with securing mechanism according to FIG. 11 connected thereto;

DESCRIPTION OF PREFERRED EMBODIMENTS

Figure 1:
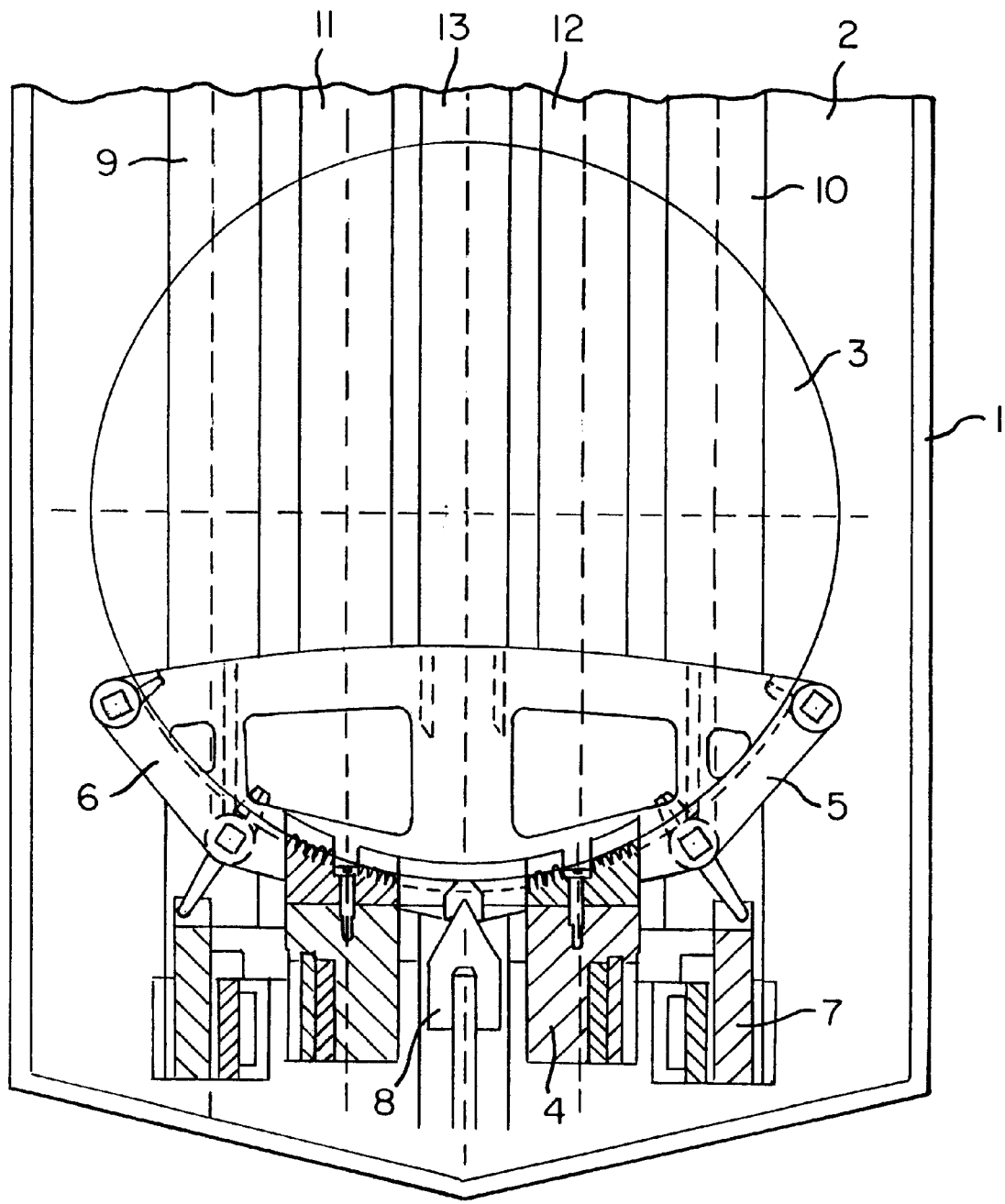
FIG. 1 a cross-sectional view of the container of the inventive device for wet treatment.

In the drawings the same reference numerals indicate same elements of the inventive device for wet treatment of substrates. A detailed description of elements will not be provided for a Figure when these elements have been explained in conjunction with another Figure.

In FIG. 1 a container 1 with treatment fluid 2 is shown. Substrate 3, for example, semi-conductor wafers of a diameter of 300 mm, are disposed in the container 1 for a chemical wet treatment. The substrates 3 are supported in a receiving device 4 for the substrates 3 within the container 1. The substrates 3 no longer rest on the substrate carrier 5. In FIG. 1 this can be seen because the substrate edges are spaced from the support area 6 (see dashed line) of the substrate carrier 5. The substrate carrier 5 is supported by a substrate carrier receiving unit 7 in the container 1. Furthermore, in the container 1 a blade-shaped lifting device 8 for lifting the substrates 3 from the container 1 is provided. For connecting the receiving unit 7 for the substrate carrier 5 with a transporting device which will be disclosed in the following in conjunction FIGS. 2 and 3, vertical rods 9, 10 are provided. The receiving device 4 is connected to vertical rods 11, 12. The blade-shaped lifting device 8 with a transport mechanism not represented in FIG. 1 is connected to the vertical sections 13 of a bent rod.

Figure 2:
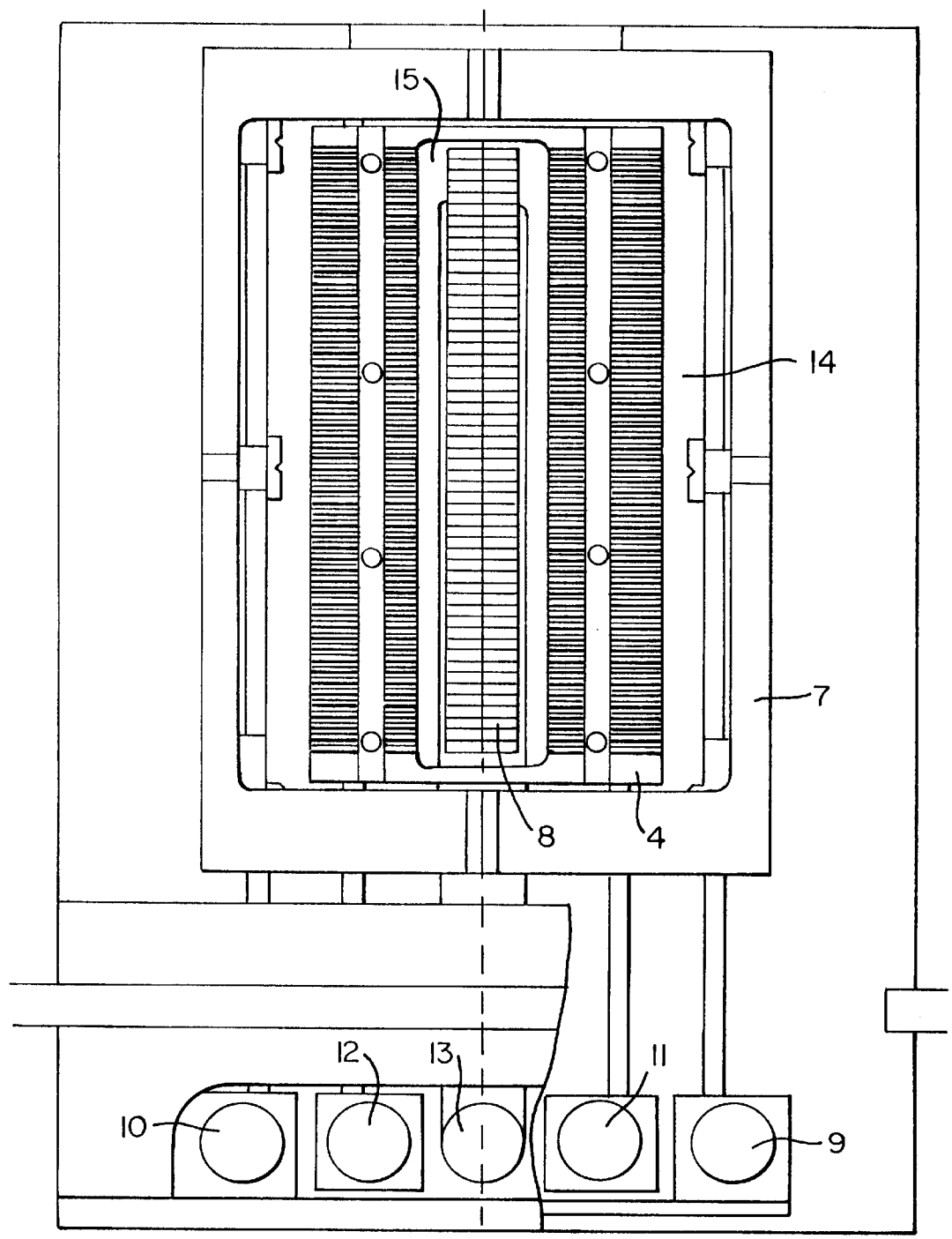
FIG. 2 a top view of the container of FIG. 1.

FIG. 2 shows in a view from above the container 1 of FIG. 1 whereby, for a better understanding, the substrates 3 and the substrate carrier 5 have been omitted. It can be seen in FIG. 2 that the receiving unit 7 for the substrate carriers (not represented in FIG. 2) comprises a rectangular opening 14. The receiving device 4 is arranged in the lowermost position within the opening 14 of the receiving unit 7 and is movable through this opening and through the receiving unit 7 in the vertical direction in order to lift the substrates out of the non-represented substrate carrier 5 and to receive them. The receiving device 4 for the substrates 3 comprises a rectangular opening 15 that is smaller than the rectangular opening 14. Within the rectangular opening 15 the blade-shaped lifting device 8 is arranged and is movable therethrough in the vertical direction.

Figure 3:
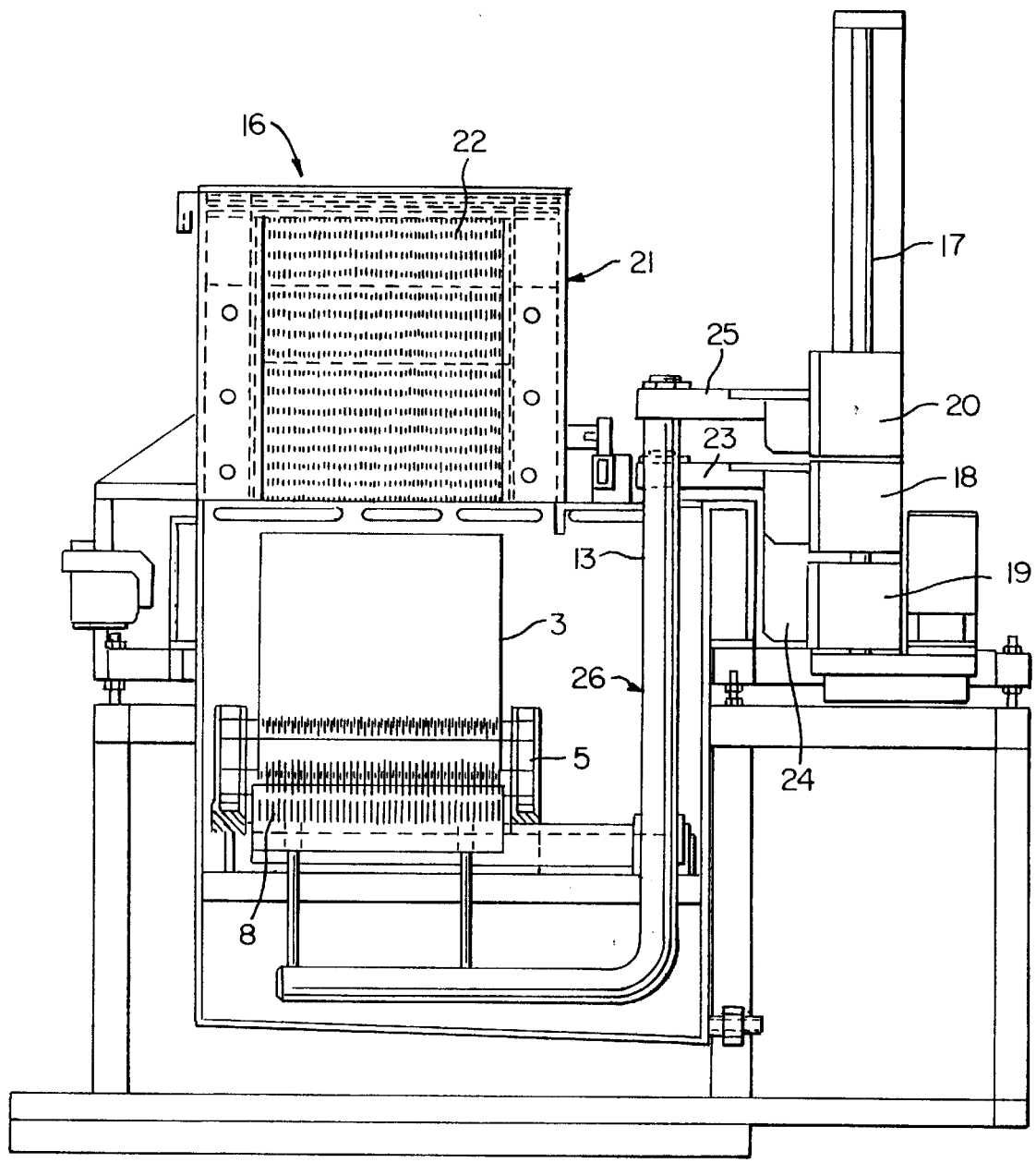
FIG. 3 a cross-sectional view of the inventive device for wet treatment.
Figure 4:
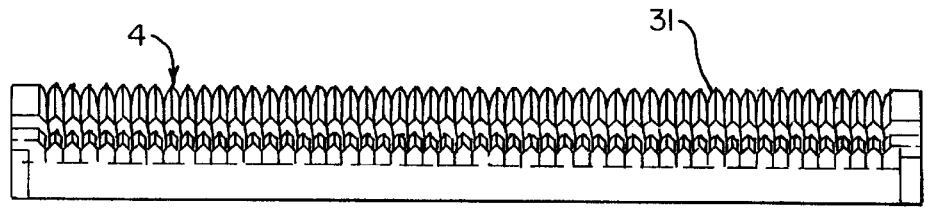
FIG. 4 a longitudinal sectional view of the inventive substrate receiving device.

In FIG. 3 a cross-sectional view of the inventive device 16 for chemical treatment is represented. On a vertical guide 17 a first transport carriage 18 for the receiving device 4, a second transporting carriage 19 for the receiving unit 7 of the substrate carrier 5, and a third transport carriage 20 for the knife-shaped lifting device 8 are slidably arranged. The transport carriages 18, 19, 20 are moved by non-represented drive means along the guide 17 in the vertical direction. For a rigid connection of the first transport carriage 18 with the receiving device 4 for the substrates 3, a first arm 23 is provided which connects the first transport carriage 18 to the vertical rods 11, 12. For connecting the second transport carriage 19 with a receiving unit 7 for the substrate carrier 5, a second arm 24 is provided which connects the second transport carriage 19 to the vertical rods 9, 10. For connecting the third transport carriage 20 with the bladeshaped lifting device 8, a third transport arm 25 is provided which connects the third transport carriage 20 to the vertical portion 13 of the bent rod 26 that supports the lifting device 8.

The first transport carriage 18 is connected with the second transport carriage 19 via a non-represented pneumatic cylinder. Since the first transport carriage 18 is rigidly connected to the receiving device 4 for the substrates 3 and the second transport carriage 19 is rigidly connected to the receiving unit 7 for the substrate carrier 5, the substrate 3 is moved into the position represented in FIG. 1 upon actuation and extension of the pneumatic cylinder. The substrates 3 then rest no longer within the substrate carrier 5, but are received and centered within the receiving device 4 and secured therein.

Above the container 1 a removable hood 21 is arranged which at opposed inner sides has guide slots 22 corresponding to the slots of the receiving device 4 for the substrates 3.

The first transport carriage 18 or the second transport carriage 19 is coupled with the third transport carriage 20 via a (non-represented) linkage that runs along a non-represented curved disk in order to slow down the receiving device 4 relative to the blade-shaped lifting device 8 during removal of the substrates 3. The receiving device 4 for the substrates 3 is slowed down relative to the blade-shaped lifting device 8 and is passed by it for removal of the substrates 3 from the container 1. An example of such a linkage is disclosed in German patent application P 195 00 239. In order to avoid repetition reference is made to this disclosure.

With reference to FIGS. 4 through 9 the receiving device 4 for the substrates 3 will be disclosed in detail.

Figure 5:
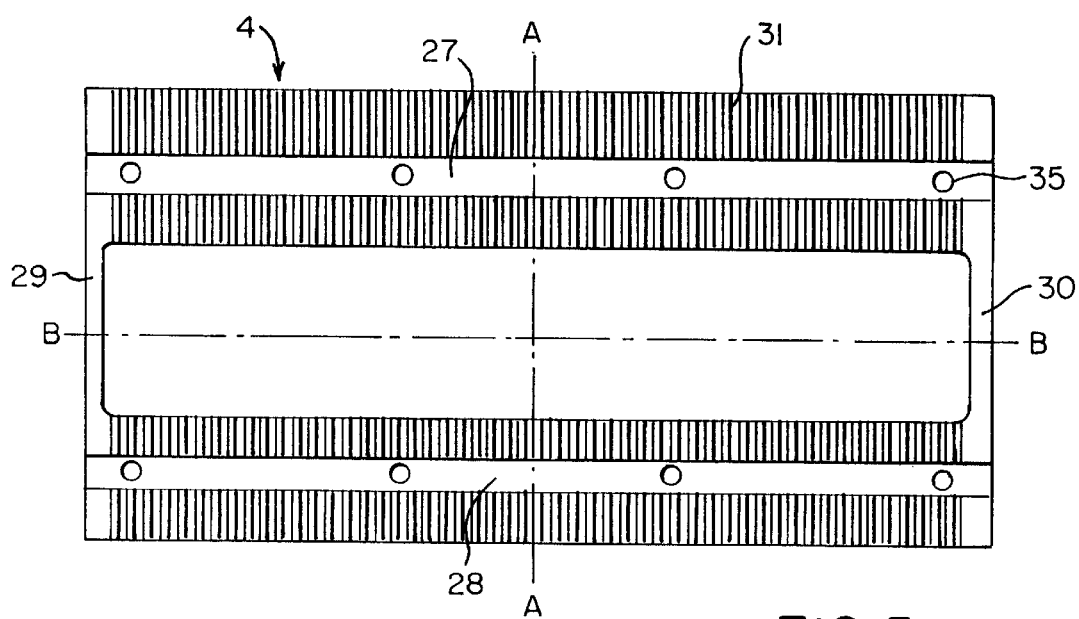
FIG. 5 a top view onto the inventive substrate receiving device of FIG. 4.
Figure 8:
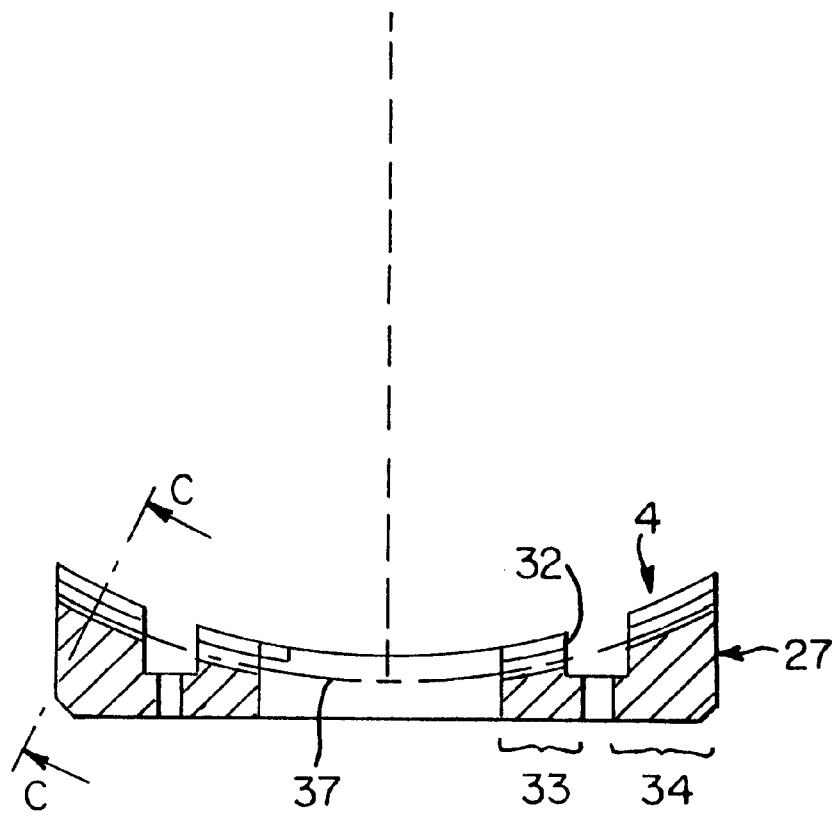
FIG. 8 a cross-sectional view of the inventive substrate receiving device of FIGS. 4 through 7.

In FIG. 5 it can be seen that the receiving device 4 for the non-represented substrates 3 has the shape of a frame. The receiving device 4 is designed symmetrically to the axis B—B, as shown in FIG. 5. The receiving device 4 comprises two oppositely arranged longitudinal sides 27, 28 and two shorter opposite narrow sides 29, 30. On the longitudinal sides 27, 28 a number of (transverse) slots 31 is provided. Due to this embodiment the receiving device 4 can also be used as a centering comb. With reference to FIG. 8, the cross-section of one of the longitudinal sides 27 of the receiving device 4 will be disclosed in more detail. In FIG. 8, a cross-section of one slot 31 is represented. The longitudinal side 27 is divided by a groove 32, which extends along the entire length of the longitudinal side 27, into an inner section 33 and an outer section 34. In the groove 32 bores 35 are provided in order to connect the receiving device 4 with the support structure 36 positioned underneath and visible in FIG. 6. The underside of the longitudinal side 27 is horizontal while the upper side of the longitudinal side 27 has a shape that is complimentary to the substrate edges 3. This holds true also for the bottom of the slots 31. In FIG. 8 a circular edge segment of an inserted substrate 3 is schematically indicated by dashed line 37. The slot bottoms form a part of a circular circumference which corresponds to the radius of the substrate 3.

Figure 9:
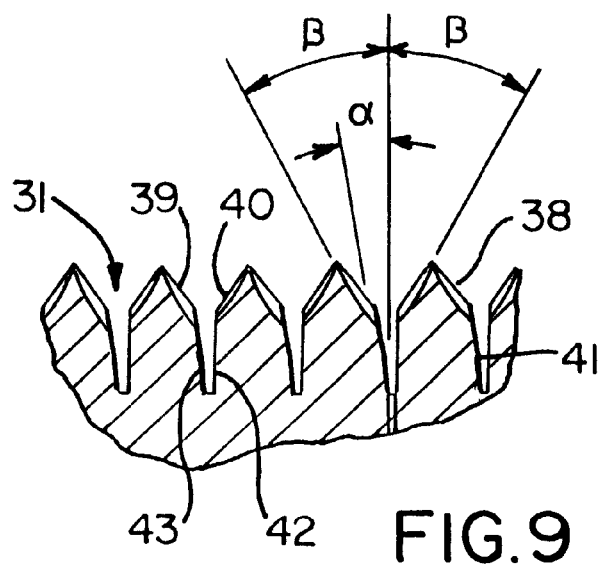
FIG. 9 a sectional view of a part of FIG. 8 along the line c—c.

With reference to FIG. 9, the embodiment of the slots 31 will be disclosed in detail. The slots 31 comprise a first section 38 pointing to the slot opening in which the slot walls 39, 40 are arranged at a slant angle β to the vertical of, for example, 30°. A second section 41 which extends to the slot bottom, has a vertical wall 42 and a slanted wall 43 extending at an angle a of, for example, 10° to the vertical wall 42. The structure of the second section 41 allows a clamping of the substrate 3 and provides for the required centering and alignment.

Figure 6:
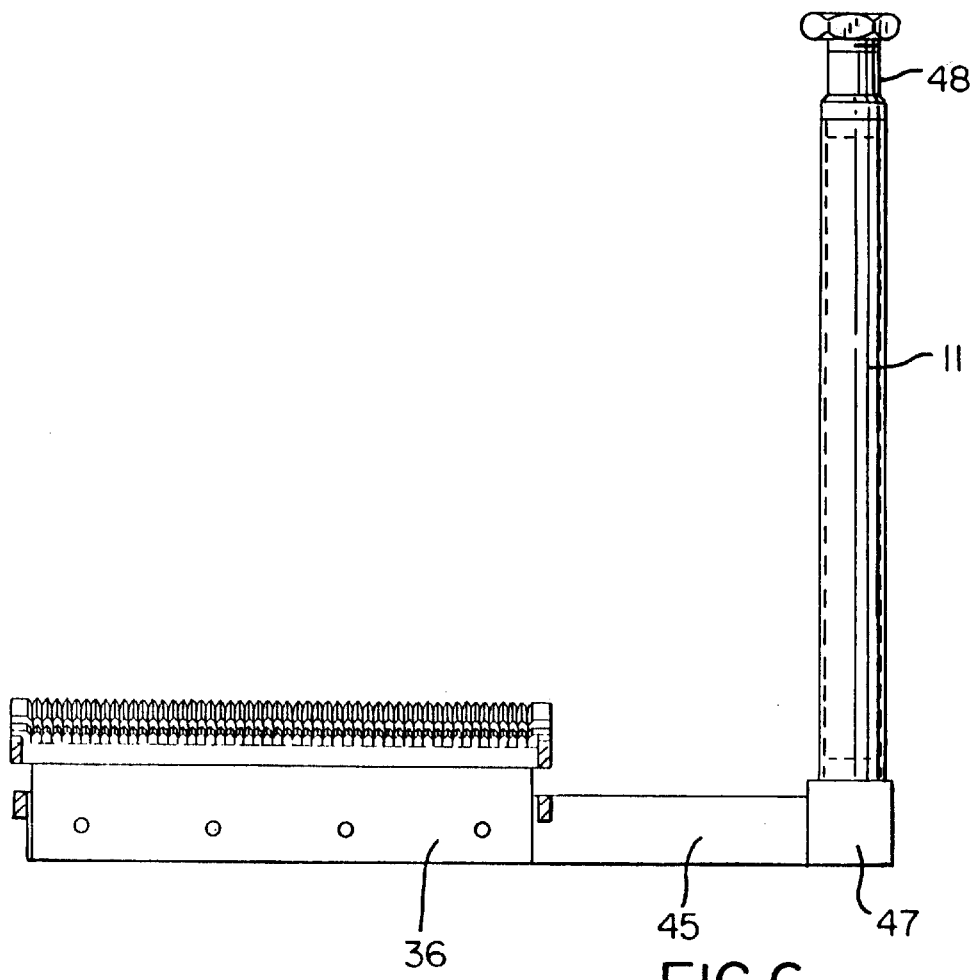
FIG. 6 a longitudinal sectional view of the inventive substrate receiving device of FIGS. 4 and 5 with a securing mechanism connected thereto.
Figure 7:
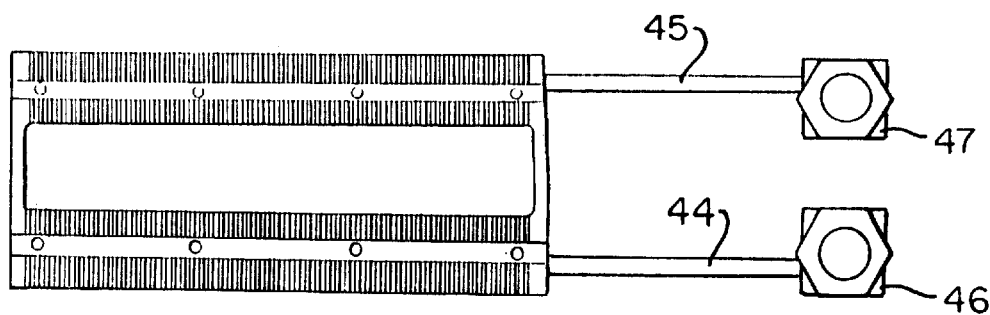
FIG. 7 a top view onto the inventive substrate receiving device with the connected mechanism according to FIG. 6.

In FIGS. 6 and 7 it is shown that the support structure 36 is connected with vertical rods 44, 45 to cubical coupling elements 46, 47. The cubical coupling elements 46, 47 connect the horizontal rods 44, 45 with vertical rods 11, 12. The vertical rods 11, 12 have, at their ends facing away from the coupling elements 46, 47, a portion 48 which may be engaged by the first transport arm 23 of the first transport carriage 18 in order to connect the first transport carriage 18 rigidly to the vertical rods 11, 12 and thus with the receiving device 4 for the substrates 3.

Figure 10:
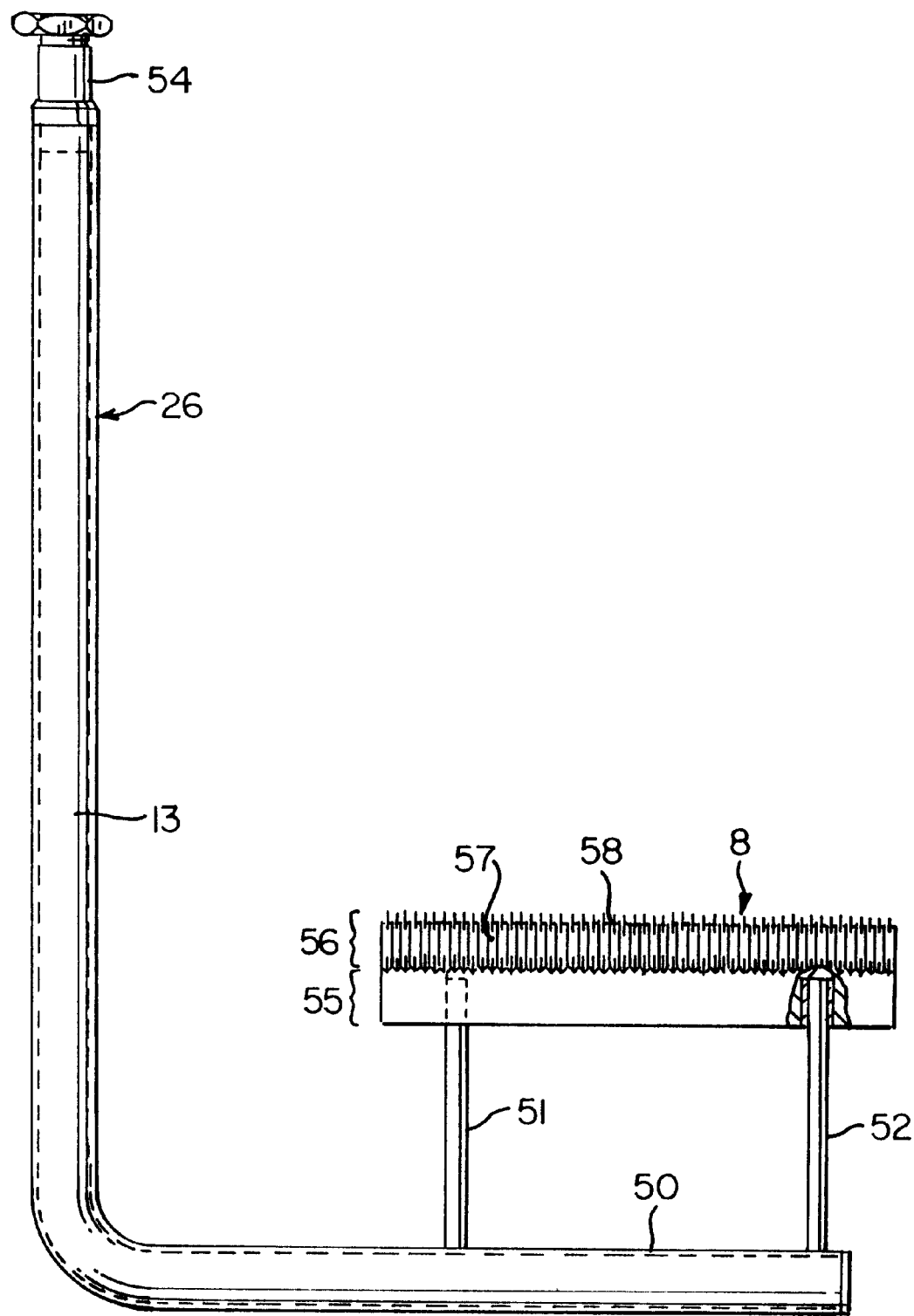
FIG. 10 a cross-sectional view of the inventive blade-shaped lifting device for the substrate with a securing mechanism connected thereto.

In FIG. 10, a cross-section of the blade-shaped lifting device 8 with connected lifting mechanism is represented. For connecting the blade-shaped lifting device 8 with the third transport carriage 20, a bent tube 26 is provided that has a vertical portion 13 and a horizontal portion 50. The blade-shaped lifting device 8 is connected to the horizontal section 50 of the rod 26, bent at a right angle, via two vertical rods 51, 52. At the upper end of the bent rod 26, a portion 54 is provided which corresponds to the portion 48 and which is engaged by the third transport arm 25 in order to rigidly connect the blade-shaped lifting device 8 to the third transport carriage 20. The blade-shaped lifting device 8 comprises a parallelepipedal portion 55 and a pointed portion 56. The pointed portion 56 has sides that taper toward one another whereby only the side 57 is shown in FIG. 10. The tapering sides have slots or grooves 58 in order to separately lift the substrates 3. The slots 58 are aligned, respectively, arranged to match the transverse slots 31 of the receiving device 4 for the substrates 3 and the guide slots 22 of the hood 21.

Figure 13:
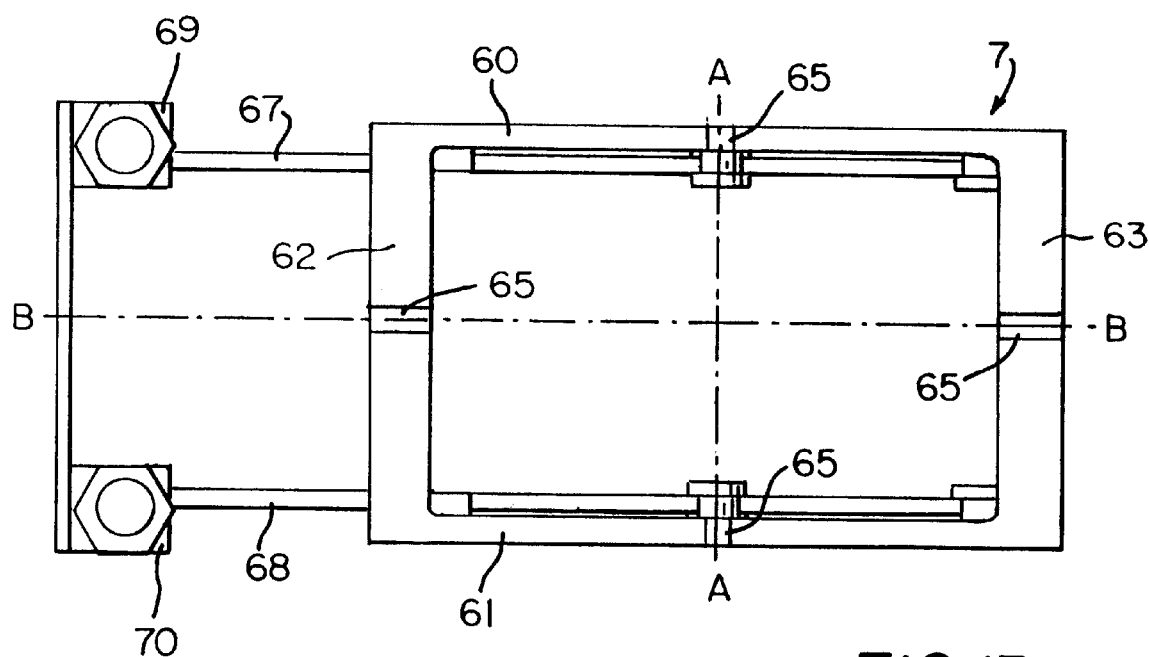
FIG. 13 a top view onto the receiving unit for the substrate carrier with securing mechanism of FIGS. 11 and 12 connected thereto.
Figure 14:
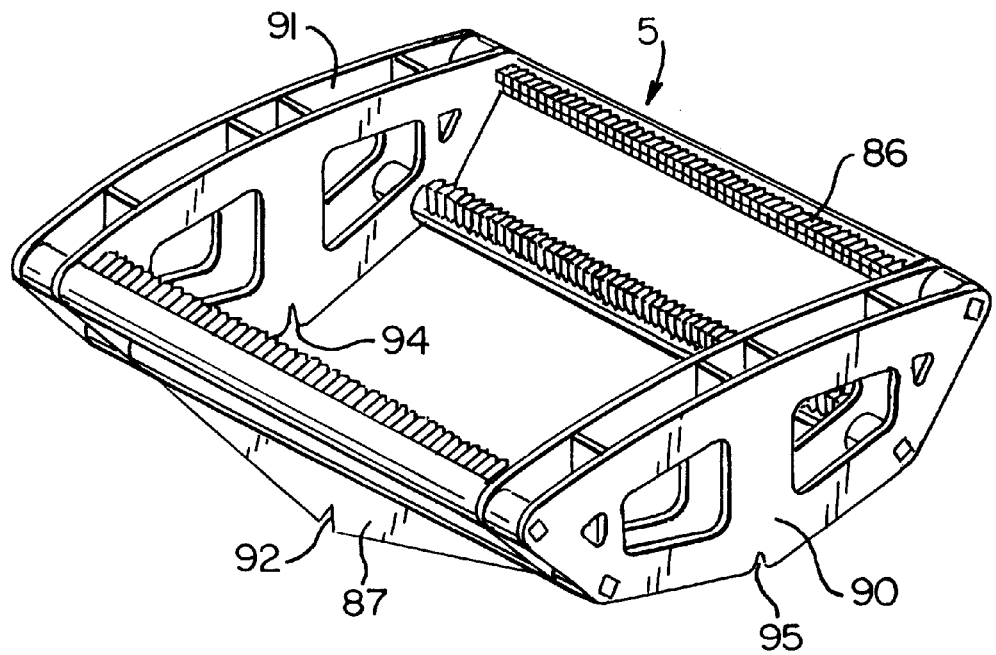
FIG. 14 a perspective view of the inventive substrate carrier.
Figure 15:
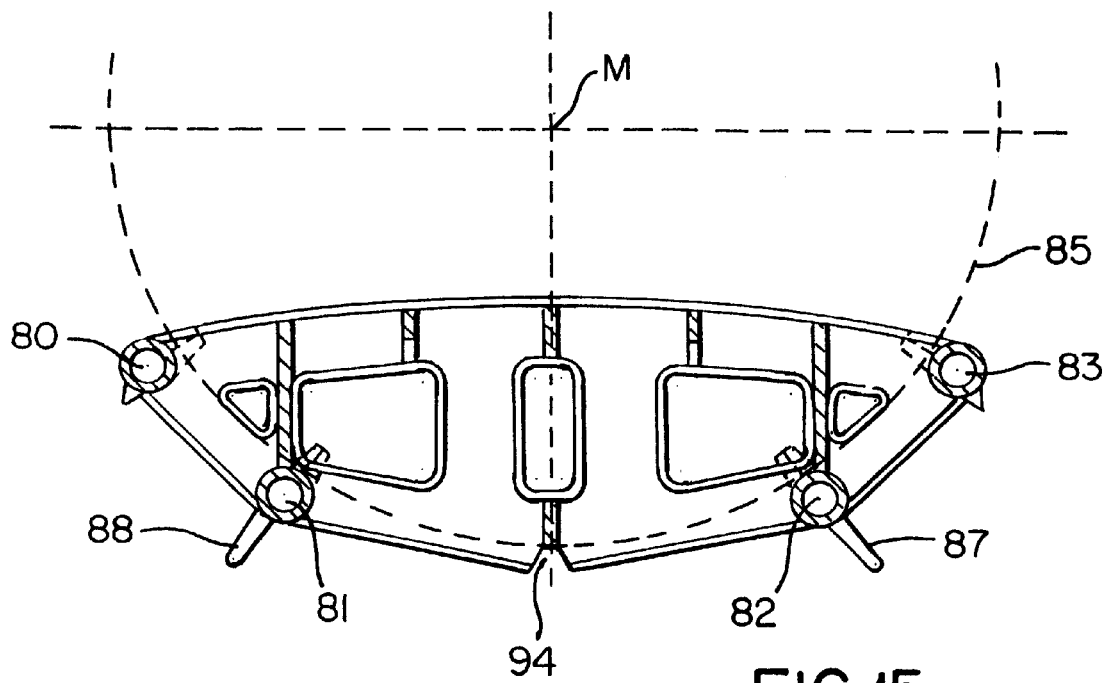
FIG. 15 a cross-sectional view of the inventive substrate carrier of FIG. 14.
Figure 16:
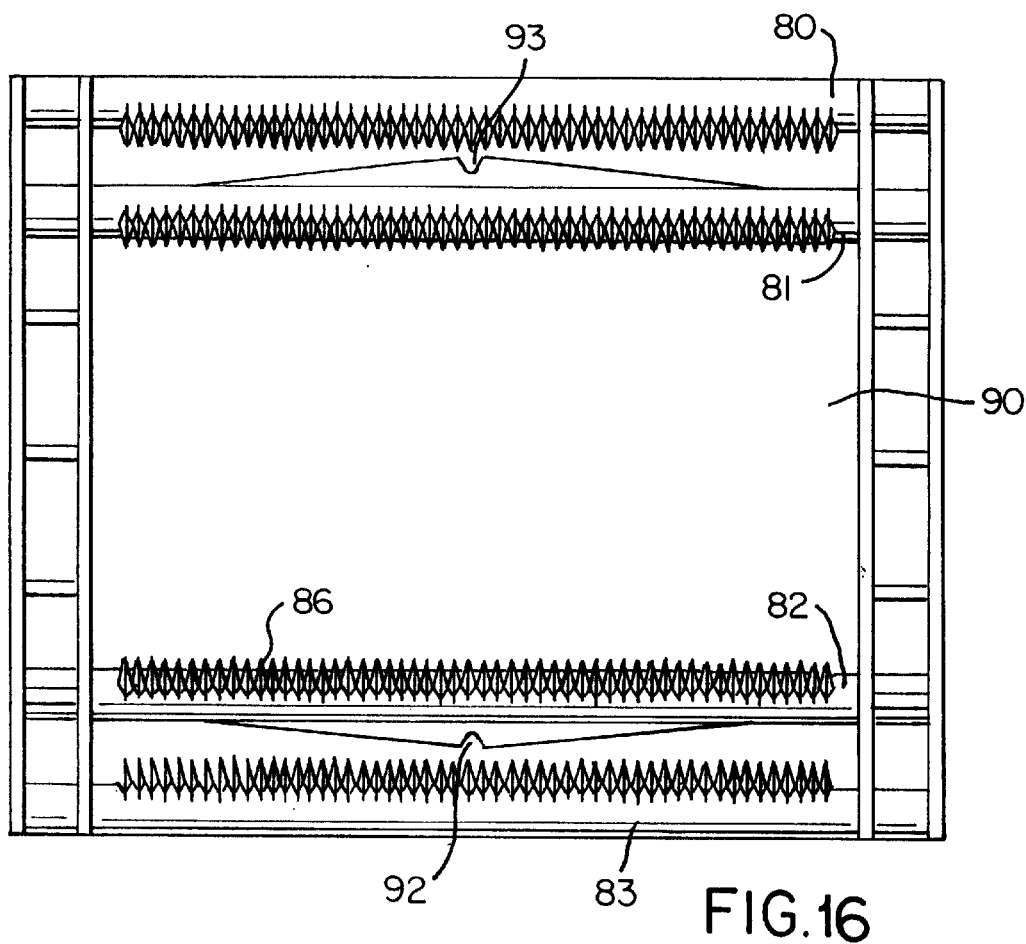
FIG. 16 a top view onto the inventive substrate carrier of FIGS. 14 and 15.
Figure 17:
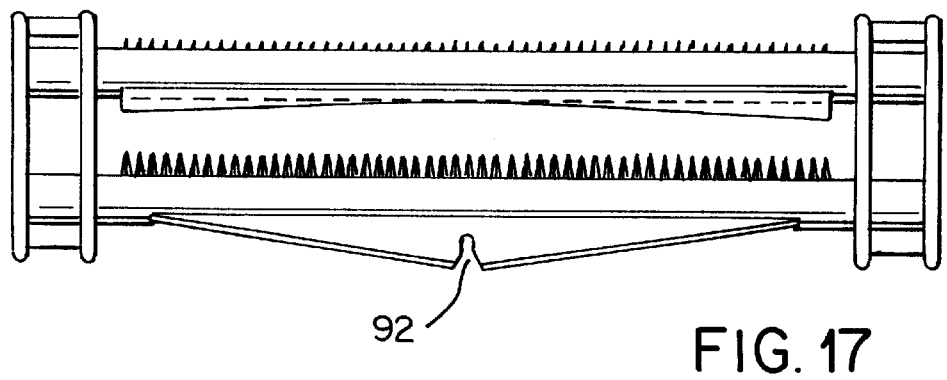
FIG. 17 a longitudinal sectional view of the inventive substrate carrier according to FIGS. 14 through 16.

With reference to FIGS. 11 through 13, the receiving unit 7 for the substrate carrier 5 will be disclosed in detail. It can be seen in FIG. 13 that the receiving unit 7 has the shape of a frame. The receiving unit 7 is symmetrical to the line B—B shown in FIG. 13. The receiving unit 7 has oppositely arranged longitudinal sides 60, 61 and two oppositely arranged narrows sides 62, 63. In the middle of the sides 60, 61, 62 and 63 centering notches 65 are provided in order to align the non-represented substrate carrier 5 with the receiving unit 7. Two vertical rods 67, 68 support the receiving unit 7 below the longitudinal side 60 and 61. The horizontal rods 67, 68 are connected with cubical coupling elements 69, 70 to the vertical rods 9, 10. At their ends remote from the cubicle coupling elements 69, 70, the vertical rods 9, 10 are provided with portions 71 corresponding to the grooves 48 and 54. The portions 71 are provided in order to allow engagement by the second transport arm 24 and in order to connect the second transport carriage 19 rigidly with the receiving unit 7.

With reference to FIGS. 14 through 17, the inventive substrate carrier 5 will be explained in detail.

The substrate carrier 5 comprises four rods 80, 81, 82, 83. The rod axes are arranged on a circular arc which is concentric to the circumference of the substrates 3 represented by the dashed line 85 shown in FIG. 15. The rods 80 to 83 are provided with slots 86 pointing to the center of the substrates 1 whereby the bottoms of the slots 86 are positioned on a circular arc which is indicated by the line 85 and represents the edge of the substrate. The rods 80 to 83 are secured by two oppositely arranged profiled lateral supporting elements 90, 91. The lateral supporting elements 90, 91 and the rods 81, 82 have centering grooves at their center in which the centering wedges 65 of the receiving unit 7 for the substrate carrier will engage. The slots 86 are positioned so as to be aligned with the slots 31 of the receiving device 4 for the substrates 3, the slots 58 of the blade-shaped lifting device 8, and the slots 22 of the hood 21. The inner rods 81, 82 define a rectangular opening 90 through which the receiving device 4 for the substrates 3 and the blade-shaped lifting device 8 can be moved in the vertical direction.

Due to the contact locations at the substrate carrier 5, arranged centrally with respect to the longitudinal and the transverse direction, for placing onto the receiving unit 7 in the treatment container 1 of the device, the substrate carrier maintains an exactly defined position when the dimensions of the substrate carrier 5 change because of temperature fluctuations occurring during the treatment process. This exact positioning of the substrate disks is advantageous with respect to easy handling of the substrates and for preventing breakage. In the alternative, it is possible to provide an arrangement in which only two contact locations of the substrate carrier, centrally arranged in the longitudinal or in the transverse direction, and further contact locations are in the form of contact points displaceable on the container bottom so that the positioning of the substrate carrier during temperature fluctuations remains unchanged.

The lateral transport elements 90, 91 in the form of profiled members have, as is shown in FIGS. 14–17, transverse stays at which they can be engaged for handling of the substrate carrier, i.e., for lifting it from and placing it into the container 1. This eliminates longitudinal supports connected to the exterior of the lateral transport elements, as disclosed, for example, in German patent application P 44 28 169.2. This embodiment provides a more compact substrate carrier that can be more easily handled.

In FIGS. 18 to 23 a cross-sectional view of the inventive device 17 in different processing steps is shown. With respect to FIGS. 18 through 24 the inventive drying process for the substrates 1 is shown in detail.

Figure 18:
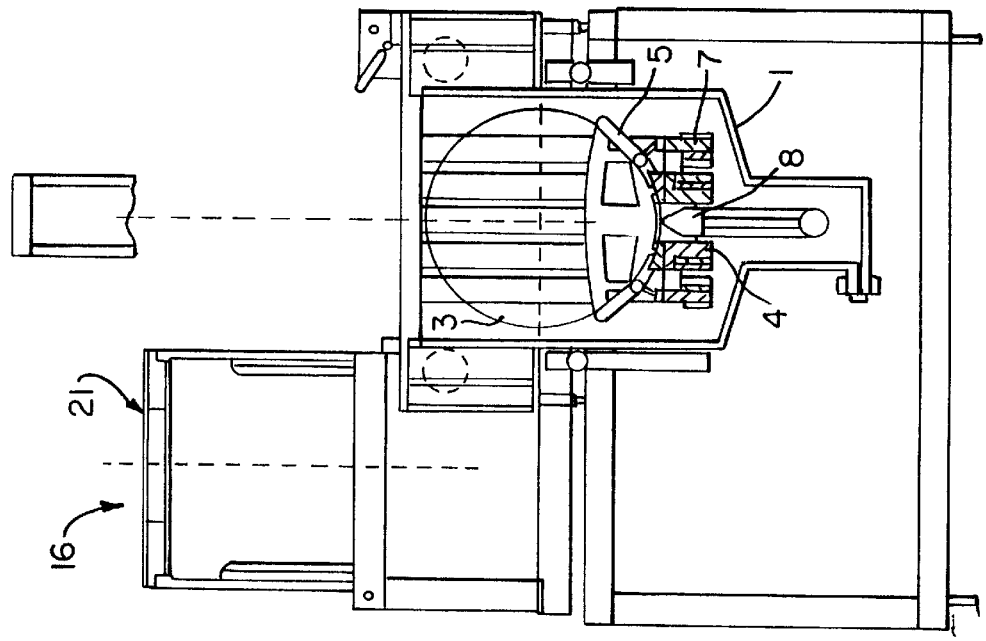

From FIG. 18 it can be taken that the substrate carrier 5 with the substrates 3 positioned therein is inserted into the receiving unit 7 for the substrate carrier 5 in the container 1. Upon actuation of a non-represented pneumatic cylinder, the transport carriages 18, 19 are separated by approximately 10 mm, and, preferably, the receiving unit 7 is moved downwardly by about 10 mm. Thus, the substrates 3 are lifted from the substrate carrier 5 and rest on the receiving device 4 for the substrates 3, which can be seen best in the enlarged representation of FIG. 1.

Figure 19:
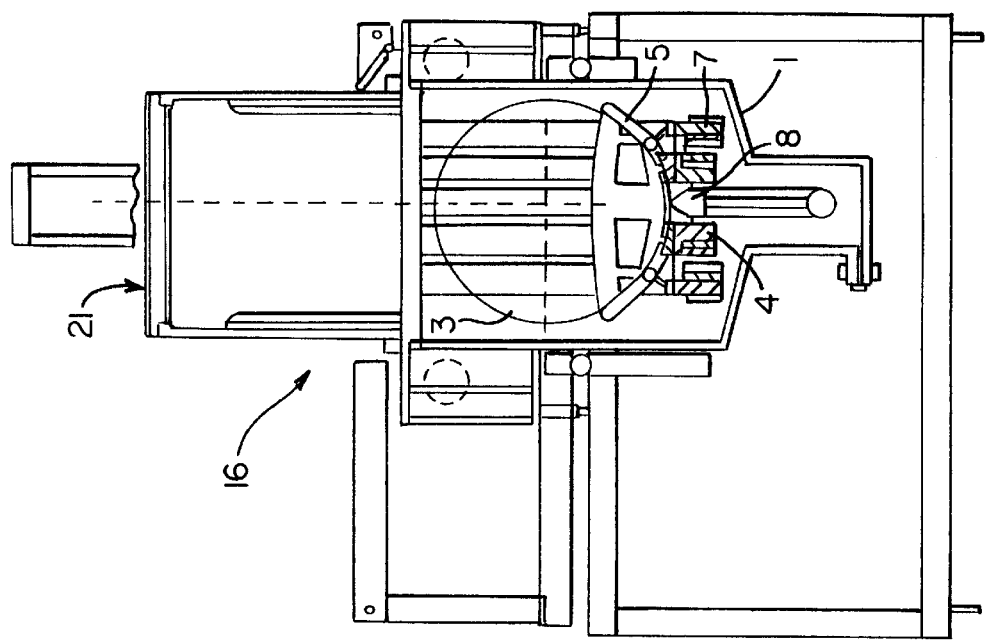
FIGS. 18 through 23 individual steps for drying the substrates with the inventive device.

FIG. 19 represents the beginning of the drying process. Accordingly, the hood 21 is moved on top of the container 1 and a vapor atmosphere is generated within the interior of the hood 21 whereby the vapor will not condense on the substrates 3 and is immiscible with the treatment fluid 2, and whereby the mixture of treatment fluid 2 and vapor has a surface tension that is smaller than the surface tension of the treatment fluid 2. The details of such a drying method can be taken from the aforementioned European patent application EP-A-0 385 536.

With a corresponding movement of the coupled transporting carriages 18, 19, and 20, the blade-shaped lifting device 8 and the receiving device 4 for the substrates 30 and the substrate carrier 5 are lifted together in the upward direction.

Figure 20:
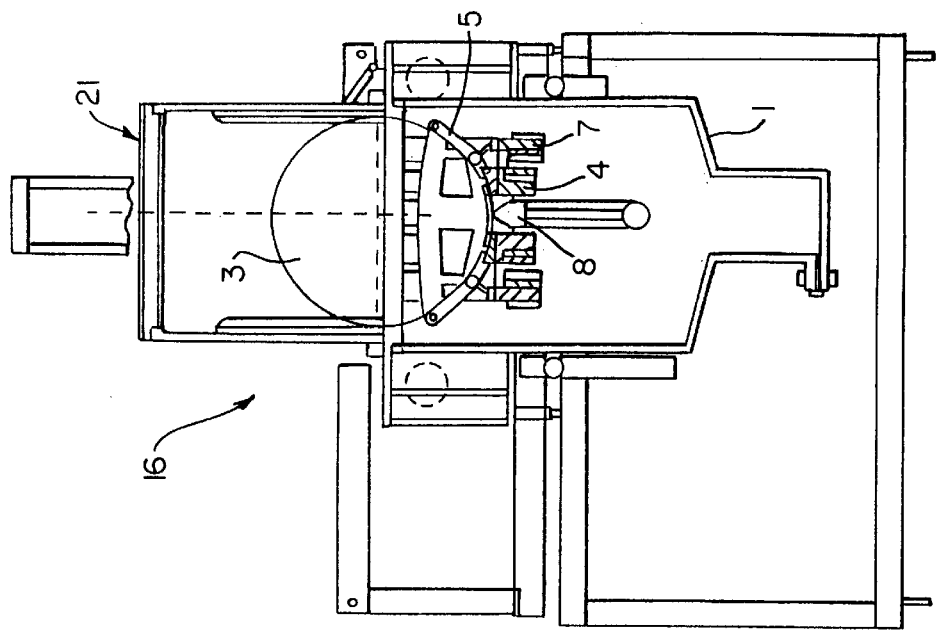

FIG. 20 shows a situation in which the receiving device 4 for the substrates relative to the blade-shaped lifting device 8 is slowed down. This differential stroke is realized with the linkage positioned between the transport carriages 18 or 19 and the third transport carriage 20, as has been disclosed in detail in the aforementioned German patent application 195 00 239.

Figure 21:
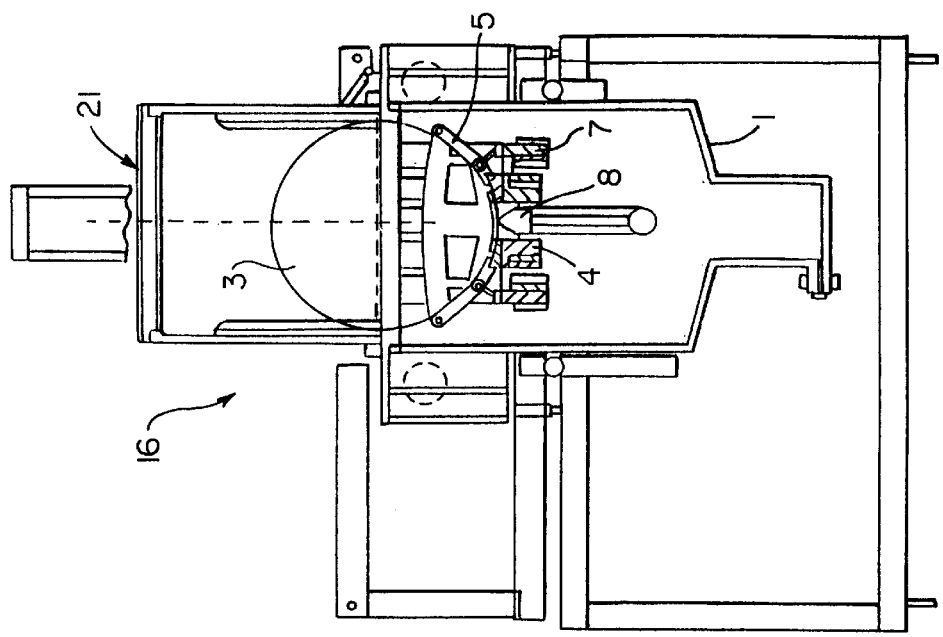

FIG. 21 shows a situation in which the receiving device 4 for the substrates 3 has come to a complete stop and the substrates 3 are moved further upwardly whereby they are only secured by the blade-shaped lifting device 8. The substrates 3 glide into the guides 22 of the hood 21.

Figure 22:
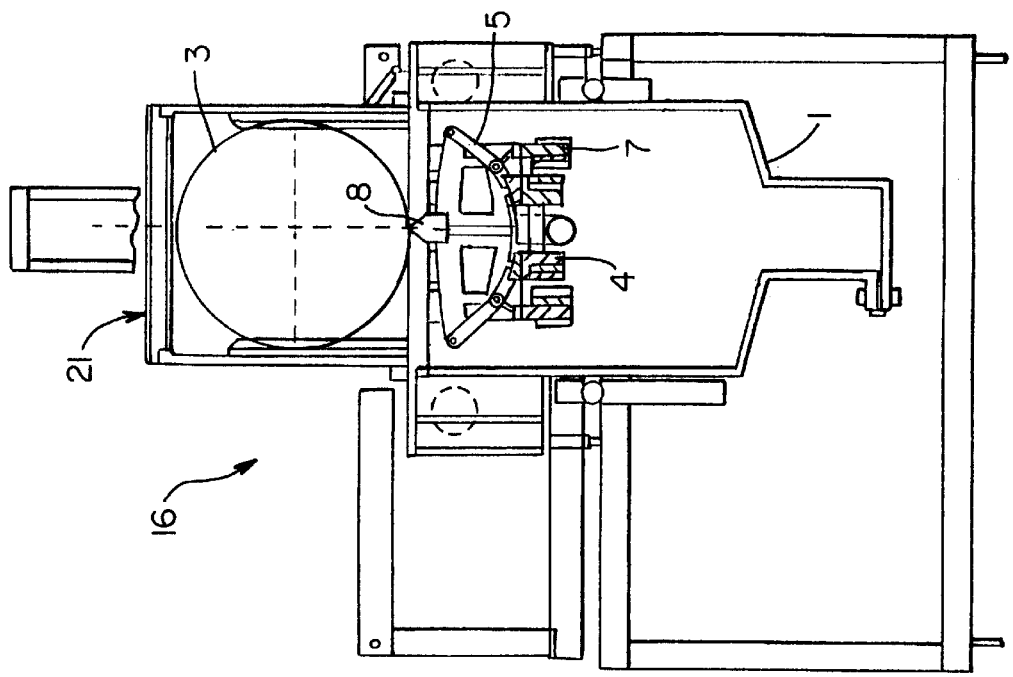

FIG. 22 shows that the receiving unit 7 for the substrate carrier 5 and thus the substrate carrier 5 cannot be moved farther upwardly. The substrate carrier 5 thus remains completely within the treatment fluid 2 of the container 1 while the substrates 3 are lifted from out of the treatment fluid 2 by the blade-shaped lifting device 8.

Figure 23:
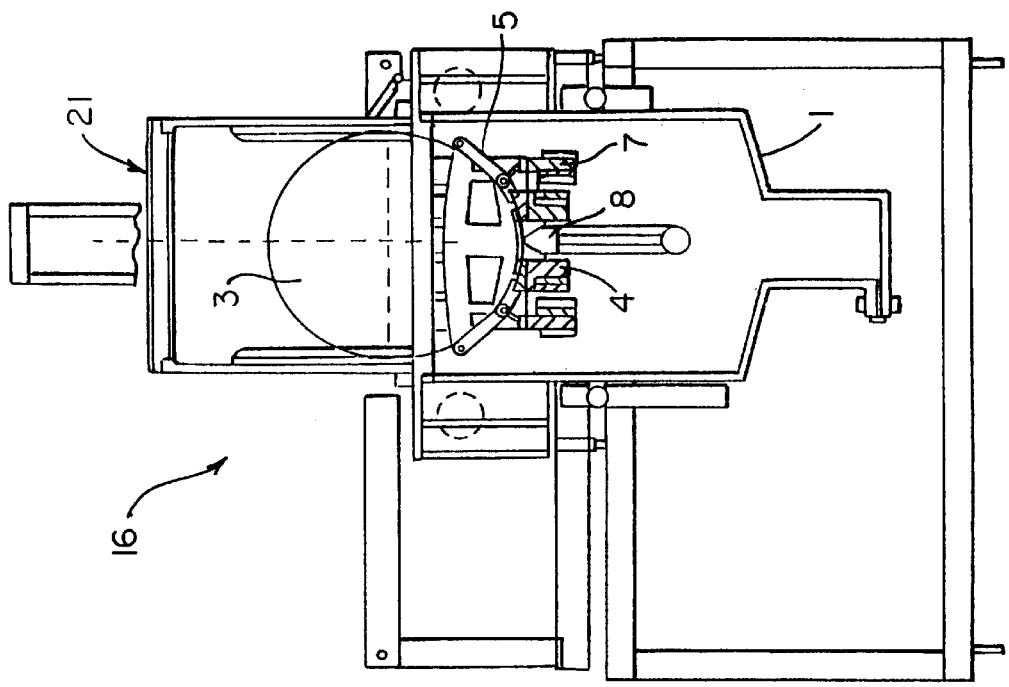

FIG. 23 shows a situation in which the substrates 3 are completely lifted out of the treatment fluid 2. The substrates 3 are positioned completely within the hood 21 and are guided by the lateral guides 22 within the hood 21 and by the blade-shaped lifting device 8 which has been moved into a position above the liquid level of the treatment fluid 2 in the container 1. The substrate carrier 5 is dried by outflow of the treatment fluid. With a further actuation of the pneumatic cylinder in the opposite stroke direction the receiving unit 7 for the substrate carrier 5 is lifted by approximately 10 mm. The substrates 3 are unloaded by lowering the blade-shaped lifting device 8 onto the dried substrate carrier.

The substrates thus are no longer positioned in the substrate receiving device after the drying process with the inventive device. Thus, it is not necessary that their alignment slots must be dry so that the slots can be optimized with respect to centering and securing of the substrates instead of with respect to a fast drying process, contrary to the slots of substrate carriers.

Finally, the hood is opened and the dried substrates contained within substrate carrier now also dried are removed together with it for a further treatment step.

Figure 25:
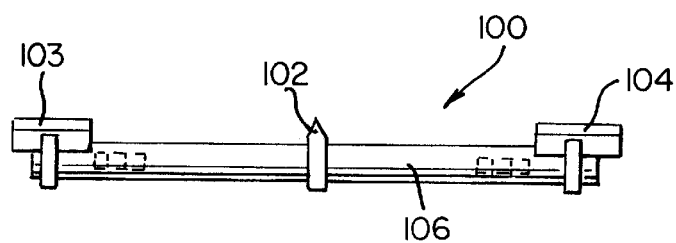
FIG. 25 a longitudinal section of the inventive adapter of FIG. 24 along the section line A—A indicated in FIG. 24.
Figure 24:
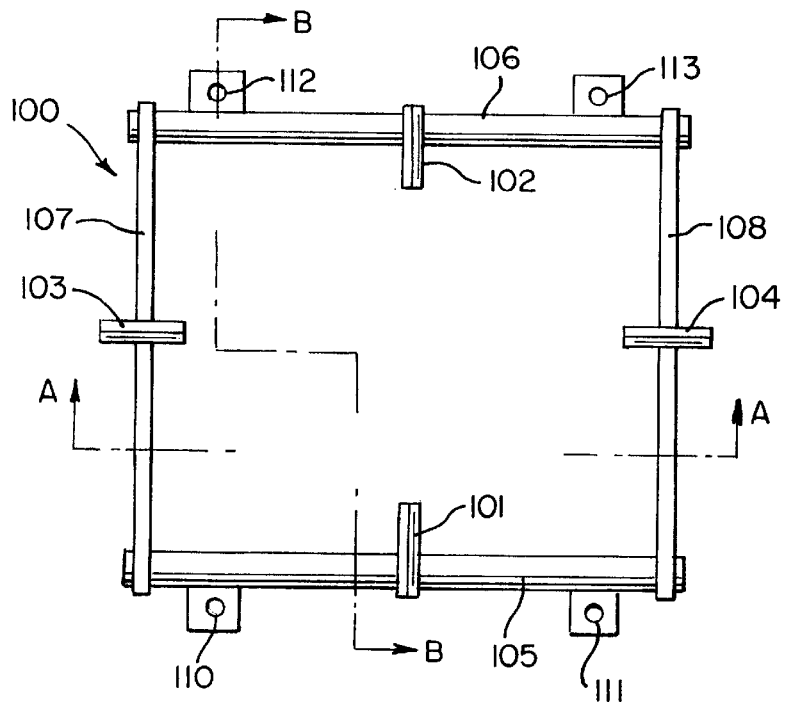
FIG. 24 a plan view of the inventive adapter.
Figure 26:
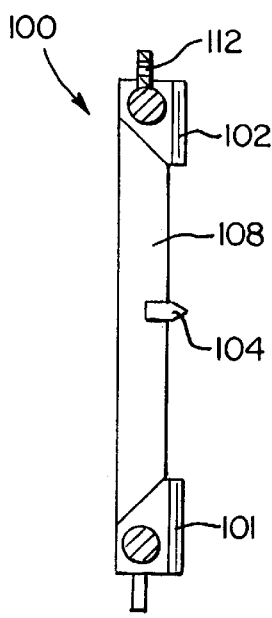
FIG. 26 a cross-sectional view of the inventive adapter of FIGS. 24 and 25 along the line B—B shown in FIG. 24.

The inventive adapter device for receiving different substrate carriers of different size in a treatment container of the device for treatment of substrates is shown in FIGS. 24–26.

The adapter is comprised of two parallel, spaced apart longitudinal beams 105, 106 connected by two perpendicularly arranged transverse beams 107, 108. Flat holding members are connected to the longitudinal beams and comprise fixation holes 110–113 engaged by fixation pins provided at the bottom of the treatment container. The adapter comprises support locations 101–104 for receiving a substrate carrier. The support locations 101–104 are centrally arranged in the longitudinal and transverse direction and are in the form of centering wedges, onto which the contact locations in the form of centering grooves of an inventive substrate carrier can be placed.

The support locations of different adapters are embodied differently according to the size of different substrate carriers, while the fixation holes 110–113 of different adapters always have the same position. It is thus possible to use in one treatment container a plurality of substrate carriers of different size with the aid of different adapters. A changing of the treatment container is thus not required.

The invention has been explained with the aid of a preferred embodiment. For a person skilled in the art, however, there are numerous deviations and other developments conceivable without deviating from the basic idea of the invention. For example, a further development of the substrate carrier could be used which is embodied such that the substrates would be lifted from the receiving device from below. Also, it would be possible, directly upon introduction of the substrate carrier with the contained substrates, by performing a suitable previous lowering of the receiving device for the substrate carrier, to lift the substrates from the substrate carrier. The inventive receiving device for the substrates could also be designed of round rods provided with slots, similar to the substrate carrier.

The present invention is, of course, in no way restricted to the specific disclosure of the specification and drawings, but also encompasses any modifications within the scope of the appended claims.

What is claimed is:

1. A device (16) for wet treatment of substrates (3) in a treatment fluid (2), said device comprising:
   a container (1) for receiving a treatment fluid;
   a substrate carrier (5) for introducing the substrates (3) into said container (1);
   a receiving device (4) for the substrates (3) arranged in said container (1); and
   a lifting device (8) for the substrates (3);
   wherein said substrate carrier (5), said receiving device (4) and said lifting device (8) are movable relative to one another in said container (1) in a vertical direction.

2. A device (16) according to claim 1, further comprising a first transport carriage (18) for said receiving device (4) and a second transporting carriage (19) for said substrate carrier (5).

3. A device (16) according to claim 2, wherein said second transport carriage (19) comprises a substrate carrier receiving unit (7).

4. A device (16) according to claim 3, further comprising a drive device for a vertical movement of at least one of said receiving device (4) and said substrate carrier receiving unit (7).

5. A device (16) according to claim 3, wherein said substrate carrier (5) comprises a substrate carrier opening (90) and said substrate carrier receiving unit (7) comprises a receiving opening (14) through which said receiving device (4) is movable in said vertical direction.

6. A device (16) according to claim 5, wherein said lifting device (8) is moveable in said vertical direction through an opening (15) in said receiving device (4), through said substrate carrier opening (90), and through said receiving opening (14).

7. A device according to claim 3, wherein said substrate carrier receiving unit (7) has at least two support locations centrally arranged in a longitudinal or a transverse direction of said substrate carrier (5) for supporting said substrate carrier.

8. A device according to claim 7, wherein said support locations are centering wedges.

9. A device (16) according to claim 2, wherein said first and second transport carriages (18, 19) are movable relative to one another.

10. A device (16) according to claim 2, wherein said first and second transport carriages (18, 19) are connected to one another for a common reciprocating movement in and out of said container (1).

11. A device (16) according to claim 2, further comprising a third transport carriage (20) for said lifting device (8).

12. A device (16) according to claim 11, further comprising a linkage connecting said first (18) or said second (19) transport carriage to said third transport carriage (20).

13. A device according to claim 11, wherein said first, second and third transport carriages (18, 19, 20) are glidably supported on a glide rod.

14. A device (16) according to claim 1, further comprising a drive device for providing the relative movement between said substrate carrier (5), said receiving device (4) and said lifting device (8) is provided.

15. A device (16) according to claim 14, wherein said drive device is a pneumatic cylinder.

16. A device (16) according to claim 1, wherein said receiving device (4) comprises slots (31).

17. A device (16) according to claim 16, wherein said slots (31) are complementary to an edge shape of the substrates (3).

18. A device (16) according to claim 16, wherein a width of said slots (31) tapers from a slot opening (38) to a slot bottom.

19. A device (16) according to claim 18, wherein said slot (31) has a first vertical wall (42) and a second wall (43) slanted at a first predetermined angle ($\alpha$) to the vertical.

20. A device (16) according to claim 19, wherein at said slot opening (38) said slot (31) has walls (39, 40) defining a second predetermined angle ($\beta$) to the vertical.

21. A device (16) according to claim 20, wherein said first predetermined angle ($\alpha$) is smaller than said second predetermined angle ($\beta$).

22. A device (16) according to claim 1, wherein said lifting device (8) is a blade-shaped strip.

23. A device (16) according to claim 1, further comprising a hood (21) to be placed on top of said container (1).

24. A device (16) according to claim 23, wherein said hood (21) has inner walls and comprises guide slots (22) for the substrates (3) arranged at least at one of said inner walls.

25. A device (16) according to claim 23, wherein a gas or gas mixture is introduced into said hood (21) for improving a drying process according to the Marangoni method.

26. A device (16) according to claim 1 for chemically wet treating the substrates.

27. A device (16) according to claim 1 for drying the substrates.

28. A device (16) according to claim 1, wherein the substrates (3) are semi-conductor wafers.

29. A device according to claim 1, wherein said substrate carrier (5) comprises two parallel side plates (90, 91) and at least two rods (80, 81, 82, 83) defining a longitudinal direction of said substrate carrier (5), wherein said at least two rods (80-83) are transversely arranged between said two side plates (90, 91), wherein said carrier (5) for placement in said container (1) has at least two contact locations (92, 93, 94, 95) arranged centrally in the longitudinal or transverse direction.

30. A device according to claim 29, wherein said contact locations (94, 95) are centrally arranged at said side plates (90, 91).

31. A device according to claim 29, wherein said contact locations (92, 93) are centrally arranged at said at least two rods (81, 82).

32. A device according to claim 29, wherein said at least two rods (81, 82) have support parts (87, 88) extending at a slant downwardly from said at least two rods, wherein said contact locations (92, 93) are centrally arranged at said support parts (87, 88).

33. A device according to claim 29, wherein said contact locations (92, 93, 94, 95) are recesses and wherein said container has matching projections, wherein said recesses are placed onto said matching projections.

34. A device according to claim 33, wherein said recesses (92, 93, 94, 95) are centering grooves and wherein said matching projections are centering wedges.

35. A device according to claim 29, wherein said two side plates (90, 91) are profiled members.

36. A device according to claim 35, wherein said two side plates (90, 91) have double walls with transverse stays.

37. A device according to claim 29, wherein said at least two rods (80, 81, 82, 83) have transverse slots (86) for securing the substrates.

38. A device according to claim 37, wherein said at least two rods (80, 81, 83) have flat projections extending radially to a center of the supported substrates (85), and wherein said transverse slots (86) are located between said flat projections.

39. A device according to claim 1, further comprising at least one adapter (100) insertable into said container (1) and comprising support locations (101–104) for contacting said substrate carrier (5).

40. A device according to claim 39, further comprising a plurality of adapters (100) insertable into said container (1) for receiving a multitude of said substrate carriers (5) of different size or design.

41. A device according to claim 39, wherein said adapter (100) has two of said support locations (101–104) centrally arranged in a longitudinal or transverse direction of said adapter for supporting said substrate carrier (5).

42. A device according to claim 39, wherein said support locations (101–104) of said adapter are centering wedges.

43. A device according to claim 39, wherein said adapter (100) has two parallel spaced apart longitudinal beams (105, 106) and two perpendicularly arranged transverse beams (107, 108) connecting said longitudinal beams (105, 106).

44. A device according to claim 39, wherein said adapter (100) comprises at least two fixation holes (110–113) and wherein said container (1) has a container bottom having fixation pins, wherein said fixation pins are received in said fixation holes (110–113).

45. A method for wet treatment of substrates (3) in a container (1) containing a treatment fluid (2), said method comprising the steps of:

introducing the substrate (3) by a substrate carrier (5) into the container (1);

transferring the substrate (3) from the substrate carrier (5) into a receiving device (4) for the substrates (3) arranged within the container (1) wherein the step of transferring includes moving the substrate carrier (5) and the receiving device (4) relative to one another; and lifting the substrates (3) by a lifting device (8) out of the container (1).

46. A method according to claim 45, wherein the step of transferring the substrates (3) from the substrate carrier (5) to the receiving device (4) includes lowering the substrate carrier (5) or lifting the receiving device (4).

47. A method according to claim 45, further including the step of separating the substrates (3) and the substrate carrier (5) for drying.

48. A method according to claim 45, wherein the step of lifting includes securing the substrates (3) within the receiving device (4).

* * * * *

UNITED STATES PATENT AND TRADEMARK OFFICE
CERTIFICATE OF CORRECTION

PATENT NO. : 6,269,822 B1 Page 1 of 1
DATED : August 7, 2001
INVENTOR(S) : Funkhänel et al.

It is certified that error appears in the above-identified patent and that said Letters Patent is hereby corrected as shown below:

<u>Title page, Item [54] and Column 1, lines 1 and 2,</u>
Should read as follows: -- DEVICE FOR WET TREATMENT OF SUBSTRATES --

<u>Title page,</u>
Item [57], should read as follows:
[57] Abstract: A device for wet treatment of substrates in a treatment fluid has a container for receiving the treatment fluid and a substrate carrier for introducing the substrates into the container. A receiving device for the substrates is arranged in the container and a lifting device for the substrates is provided. The substrate carrier, the receiving device, and the lifting device are vertically movable relative to one another in the container. Wet treatment of the substrates is carried out such that the substrates are introduced by a substrate carrier into the container, the substrates are transferred from the substrate carrier into a receiving device for the substrates arranged within the container, and the substrates are lifted by a lifting device out of the container.

Signed and Sealed this

Twelfth Day of August, 2003

JAMES E. ROGAN
*Director of the United States Patent and Trademark Office*